(12) United States Patent
Lin et al.

(10) Patent No.: US 11,355,472 B2
(45) Date of Patent: Jun. 7, 2022

(54) PACKAGE STRUCTURE AND METHOD FOR CONNECTING COMPONENTS

(71) Applicant: Industrial Technology Research Institute, Hsinchu (TW)

(72) Inventors: Yu-Min Lin, Hsinchu County (TW);
Tao-Chih Chang, Taoyuan (TW);
Wei-Chung Lo, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 117 days.

(21) Appl. No.: 16/264,689

(22) Filed: Feb. 1, 2019

(65) Prior Publication Data
US 2019/0252345 A1    Aug. 15, 2019

Related U.S. Application Data

(60) Provisional application No. 62/655,815, filed on Apr. 11, 2018, provisional application No. 62/629,706, filed on Feb. 13, 2018.

(30) Foreign Application Priority Data

Dec. 13, 2018  (TW) .................................. 107144905

(51) Int. Cl.
*H01L 23/00*    (2006.01)
*H01L 27/146*   (2006.01)

(52) U.S. Cl.
CPC .............. *H01L 24/81* (2013.01); *H01L 24/13* (2013.01); *H01L 24/16* (2013.01); *H01L 24/73* (2013.01);
(Continued)

(58) Field of Classification Search
CPC ... H01L 24/81; H01L 27/14634; H01L 24/13; H01L 24/16; H01L 24/73;
(Continued)

(56) References Cited

U.S. PATENT DOCUMENTS

| 6,846,725 B2 | 1/2005 | Nagarajan et al. |
| 9,331,043 B1 * | 5/2016 | Katkar ................ H01L 24/13 |

(Continued)

FOREIGN PATENT DOCUMENTS

| CN | 103779297 | 5/2014 |
| CN | 103985667 | 8/2014 |

(Continued)

OTHER PUBLICATIONS

"Office Action of Taiwan Counterpart Application," dated Sep. 6, 2019, p. 1-p. 13.
(Continued)

*Primary Examiner* — Robert G Bachner
(74) *Attorney, Agent, or Firm* — JCIPRNET

(57) ABSTRACT

A package structure and a method for connecting components are provided, in which the package includes a first substrate including a first wiring and at least one first contact connecting to the first wiring; a second substrate including a second wiring and at least one second contact connecting to the second wiring, the at least one first contact and the at least one second contact partially physically contacting with each other or partially chemically interface reactive contacting with each other; and at least one third contact surrounding the at least one first contact and the at least one second contact. The first substrate and the second substrate are electrically connected with each other at least through the at least one first contact and the at least one second contact.

3 Claims, 12 Drawing Sheets

(52) U.S. Cl.
CPC .. *H01L 27/14634* (2013.01); *H01L 27/14636* (2013.01); *H01L 2224/13017* (2013.01); *H01L 2224/1357* (2013.01); *H01L 2224/13147* (2013.01); *H01L 2224/13609* (2013.01); *H01L 2224/13611* (2013.01); *H01L 2224/13613* (2013.01); *H01L 2224/13639* (2013.01); *H01L 2224/13647* (2013.01); *H01L 2224/16014* (2013.01); *H01L 2224/16145* (2013.01); *H01L 2224/16147* (2013.01); *H01L 2224/16227* (2013.01); *H01L 2224/16237* (2013.01); *H01L 2224/16503* (2013.01); *H01L 2224/73204* (2013.01); *H01L 2224/8181* (2013.01); *H01L 2224/8192* (2013.01); *H01L 2224/81191* (2013.01); *H01L 2224/81203* (2013.01); *H01L 2224/81951* (2013.01); *H01L 2924/20103* (2013.01); *H01L 2924/20104* (2013.01); *H01L 2924/20105* (2013.01); *H01L 2924/20106* (2013.01)

(58) Field of Classification Search
CPC ..... H01L 27/14636; H01L 2224/81191; H01L 2924/20106; H01L 2224/1357; H01L 2224/13147; H01L 2224/13017; H01L 2224/13647; H01L 2224/13639; H01L 2224/13611; H01L 2224/13609; H01L 2224/13613; H01L 2224/16145; H01L 2224/16147; H01L 2224/16227; H01L 2224/16237; H01L 2224/16503; H01L 2224/73204; H01L 2224/81203; H01L 2224/16014; H01L 2224/8181; H01L 2224/81951; H01L 2224/8192; H01L 2924/20103; H01L 2924/20104; H01L 2924/20105; H01L 2224/05147; H01L 2224/13113; H01L 2224/05111; H01L 2224/81439; H01L 2224/05155; H01L 2224/05644; H01L 2224/13109; H01L 2224/131; H01L 2224/05139; H01L 2224/81409; H01L 2224/13155; H01L 2224/05611; H01L 2224/05613; H01L 2224/81455; H01L 2224/05639; H01L 2224/05144; H01L 2224/81447; H01L 2224/2919; H01L 2224/13139; H01L 2224/05647; H01L 2224/81411; H01L 2224/81444; H01L 2224/13111; H01L 2224/13144; H01L 2224/81413; H01L 2224/05609; H01L 2224/05655; H01L 2224/32145; H01L 2224/13082; H01L 2924/1434; H01L 2924/14; H01L 2924/1431; H01L 2924/141; H01L 2224/81385; H01L 2224/32225; H01L 2224/16225; H01L 2224/161; H01L 2224/81051; H01L 2224/818
See application file for complete search history.

(56) References Cited

U.S. PATENT DOCUMENTS

| | | | |
|---|---|---|---|
| 2004/0262753 | A1 | 12/2004 | Kashiwazaki |
| 2010/0038770 | A1* | 2/2010 | Sheats ................. H01L 23/4985 257/690 |
| 2011/0147932 | A1 | 6/2011 | Trezza et al. |
| 2013/0168851 | A1* | 7/2013 | Lin ......................... H01L 24/11 257/737 |
| 2014/0090880 | A1* | 4/2014 | Chen ................. H01L 23/49811 174/257 |
| 2014/0097534 | A1* | 4/2014 | Chang ............... H01L 21/76885 257/737 |
| 2017/0018532 | A1 | 1/2017 | Kao et al. |

FOREIGN PATENT DOCUMENTS

| | | |
|---|---|---|
| CN | 106158796 | 11/2016 |
| CN | 107210240 | 9/2017 |
| JP | 2012151288 | 8/2012 |
| JP | 2013219313 | 10/2013 |
| TW | 502353 | 9/2002 |
| TW | 201417198 | 5/2014 |
| TW | I490962 | 7/2015 |
| TW | 201705615 | 2/2017 |
| TW | I608771 | 12/2017 |

OTHER PUBLICATIONS

"Office Action of China Counterpart Application", dated Jun. 24, 2020, p. 1-p. 10.

"Office Action of Taiwan Counterpart Application", dated Mar. 12, 2020, p. 1-p. 10.

* cited by examiner

PACKAGE STRUCTURE AND METHOD FOR CONNECTING COMPONENTS

CROSS-REFERENCE TO RELATED APPLICATION

This application claims the priority benefits of U.S. provisional application Ser. No. 62/629,706, filed on Feb. 13, 2018, U.S. provisional application Ser. No. 62/655,815, filed on Apr. 11, 2018, and Taiwan application serial no. 107144905, filed on Dec. 13, 2018. The entirety of each of the above-mentioned patent applications is hereby incorporated by reference herein and made a part of this specification.

BACKGROUND

Technical Field

The disclosure relates to a package structure and a method for connecting components.

Description of Related Art

Along with the lightness and thinness of electronic devices, the current trend is trying to directly connect semiconductor components to reduce the use of interposer substrates, so as to reduce semiconductor package sizes on one hand, and simultaneously shorten electrical pathways to improve computation speeds in the semiconductor packages on the other hand. In conventional assembly methods, a soldering process is proceeded at high temperatures, however, the high temperatures would affect chip performance. In order to conform to more advanced package demands and prevent the high temperatures used in the conventional soldering and connecting processes from affecting the chip performance, new assembly methods must be continuously searched for.

SUMMARY

The disclosure provides a connection structure and a connecting method adapted for connecting semiconductor package components. The connecting method is adapted for a process for manufacturing a semiconductor package requiring a low bonding temperature. According to the connecting method provided by the embodiments of the disclosure, different components, chips and/or substrates are connected and bonded by using a low-temperature bonding process. According to the connecting method provided by the embodiments of the disclosure, a metal member is formed through a chemical plating process, which can achieve not only stable electrical connection, but also dramatically reduce a bonding temperature required for the semiconductor package from 250° C. down to a temperature below 200° C. The disclosure further provides a connection structure which can achieve stable electrical connection at a lower bonding temperature and a package including the connection structure.

According to an embodiment of the disclosure, a package structure including a first substrate, a second substrate and at least one third contact is provided. The first substrate includes a first wiring and at least one first contact, wherein the at least one first contact is electrically connected to the first wiring. The second substrate includes a second wiring and at least one second contact, wherein the at least one second contact is electrically connected to the second wiring, and the at least one first contact and the at least one second contact partially physically contact with each other or partially chemically interface reactive contact with each other. The at least one third contact surrounds the at least one first contact and the at least one second contact, wherein the first substrate and the second substrate are electrically connected with each other at least through the at least one first contact and the at least one second contact.

According to another embodiment of the disclosure, a package structure including a first substrate, a second substrate, a third contact and a fourth contact is provided. The first substrate includes a first wiring and at least one first contact, wherein the at least one first contact is electrically connected to the first wiring. The second substrate includes a second wiring and at least one second contact, wherein the at least one second contact is electrically connected to the second wiring. The third contact is located between the first contact and the second contact. The fourth contact is located between the first substrate and the second substrate. The third contact at least partially physically contacts with the first contact and the second contact, the fourth contact surrounds the first contact, the second contact and the third contact and physically contacts with the first contact, the second contact and the third contact, and the first substrate and the second substrate are electrically connected with each other at least through the first, the second and the third contacts.

According to another embodiment of the disclosure, a method for connecting components is provided. The method includes: providing a first substrate having at least one first contact and a second substrate having at least one second contact; disposing a low-temperature bonding metal on the at least one first contact of the first substrate; contacting the at least one first contact of the first substrate and the at least one second contact of the second substrate with each other; producing interface reaction between the at least one first contact and the at least one second contact at a reaction temperature below 250° C.; and plating to form a metal member to wrap around the at least one first contact and the at least one second contact.

In yet another embodiment of the disclosure, a method for connecting components is provided. The method includes: providing a first substrate having at least one first contact and a second substrate having at least one second contact, wherein the at least one first contact has a recess; contacting and fixing the at least one second contact to the recess of the at least one first contact; and plating to form a metal member to wrap around the at least one first contact and the at least one second contact.

To sum up, the disclosure provides the package structure and the manufacturing method thereof that can electrically connect the different semiconductor components at a low temperature by using the low-temperature bonding metal or the physical fixing manner in collaboration with the low-temperature chemical plating process.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Embodiments are provided below as examples and are described in detail with reference to accompanying drawings. However, the embodiments as provided are not used to limit the coverage of the disclosure. In addition, the figures only serve for the purpose of illustration and are not illustrated according to actual dimensions, and different layers or regions may be enlarged or contracted so as to be shown in a single figure. Moreover, although terms such as "first" and "second" are used herein to indicate different devices, regions and/or components, these devices, regions and/or components are not to be limited by these terms. Rather, these terms are only used to distinguish one device, region, or component from another device, region, or component. Thus, a first device, region, or component mentioned below may also be referred to as a second device, region, or component without departing from the teachings of the exemplary embodiments.

In this disclosure, relative spatial terms, such as "above" and "below" are defined with reference to the accompanying drawings. Thus, it should be understood that the terms "upper surface" and "lower surface" may be exchanged for use, and when a device, such as a layer or a film, is described as being disposed on another device, the device may be directly placed on another device, or an interposer device may exist between the two devices. On the other hand, when a device is described as being directly disposed on another device, no devices exist between the two devices.

Figure 2:
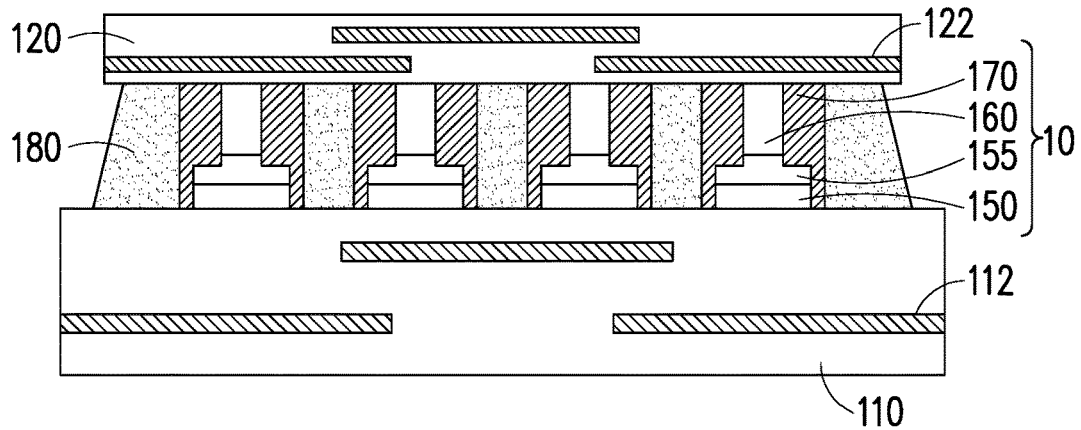
FIG. 2 is a schematic cross-sectional view showing the semiconductor package structure including a connection structure according to the first embodiment of the disclosure.
Figure 3A:
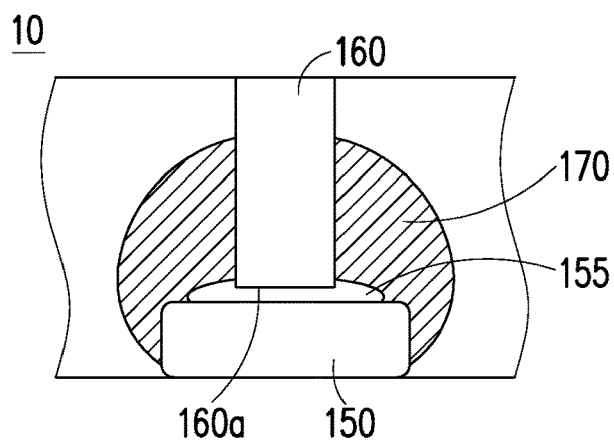
FIG. 3A and FIG. 3B are schematic enlarged cross-sectional views showing the connection structure in the package structure according to the first embodiment of the disclosure.
Figure 3B:
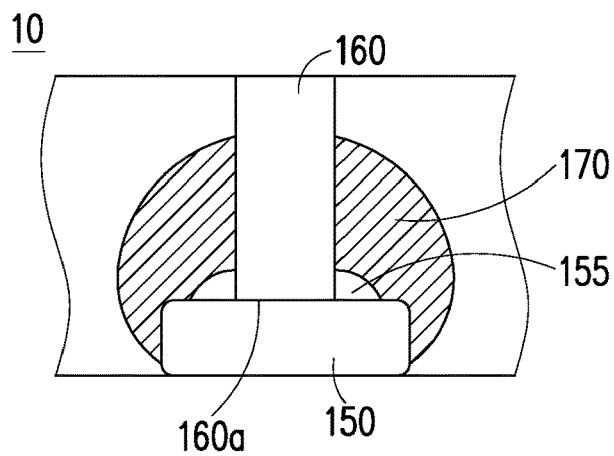

FIG. 1A through FIG. 1D are schematic cross-sectional views showing part of steps of a process for manufacturing a semiconductor package structure according to a first embodiment of the disclosure. FIG. 2 is a schematic cross-sectional view showing the semiconductor package structure including a connection structure according to the first embodiment of the disclosure. FIG. 3A and FIG. 3B are schematic enlarged cross-sectional views showing the connection structure in the package structure according to the first embodiment of the disclosure.

Hereinafter, a method for connecting different components during the process for manufacturing the package structure according to the first embodiment of the disclosure will be described with reference to FIG. 1A through FIG. 1D.

Figure 1A:
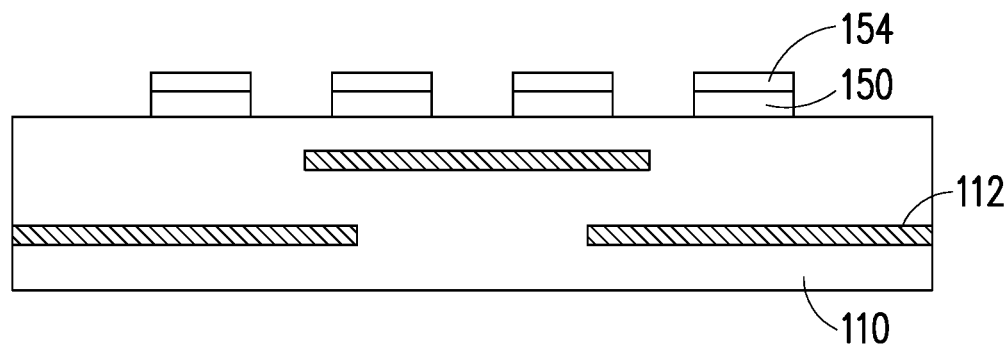
FIG. 1A through FIG. 1D are schematic cross-sectional views showing part of steps of a process for manufacturing a semiconductor package structure according to a first embodiment of the disclosure.

First, referring to FIG. 1A, a first substrate 110 with a first contact 150 on a surface thereof is provided. The first contact 150 may be electrically connected to a first wiring 112 in the first substrate 110, and a bonding material 154 may be formed on a top surface of the first contact 150. The first substrate 110 may be, for example, a semiconductor wafer including a plurality of semiconductor chips or a reconstructed wafer including a plurality of dies. The first substrate 110 may be, for example, a semiconductor die or a semiconductor chip on which a semiconductor integrated circuit is formed, including a memory chip, a logic chip, a digital chip, an analog chip, a sensor chip, a wireless and radio frequency chip or a voltage regulator chip. Therein, the sensor chip may be an image sensor chip which at least includes a charge coupled device (CCD) or a complementary metal oxide semiconductor (CMOS) image sensor. Alternatively, the first substrate 110 may be a package substrate, for example, a flexible substrate, a soft substrate, an interposer substrate or a printed circuit board. For example, the first contact 150 is formed of a conductive material. The first contact 150 may include a conductive material which is selected from, for example, nickel (Ni), tin (Sn), gold (Au), copper (Cu), silver (Ag), an alloy thereof or a composite material thereof, but the disclosure is not limited thereto. According to an embodiment of the disclosure, the first contact 150 may be a pad-like or a pier-like structure, and a cross-sectional shape thereof may be a circular shape, an elliptic shape, a quadrilateral shape, a hexagonal shape, an octagonal shape or any polygonal shape. According to an embodiment of the disclosure, the first contact 150 may be a single structure formed of a single material or a structure composed of different material blocks. The first wiring 112 may be, for example, a track, a wire, a circuit pattern or the like.

Figure 1B:
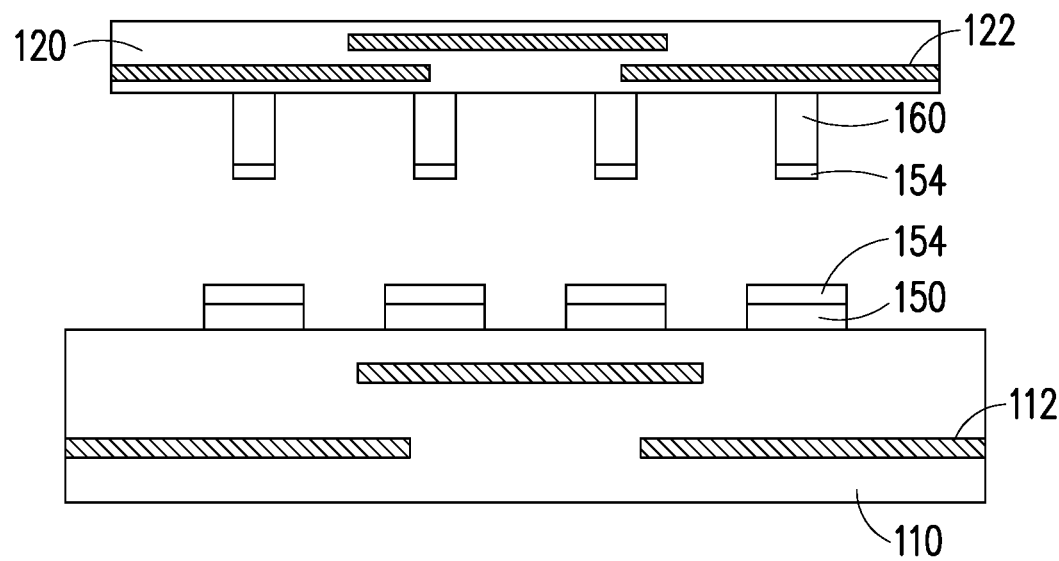

Then, referring to FIG. 1B, a second substrate 120 with a second contact 160 on a surface thereof is provided. The second contact 160 may be electrically connected to a second wiring 122 in the second substrate 120, and the bonding material 154 may be disposed on a surface (a bottom surface) of the second contact 160. The second substrate 120 may be, for example, a semiconductor wafer including a plurality of semiconductor chips or a reconstructed wafer including a plurality of dies. The second substrate 120 may be, for example, a semiconductor die or a semiconductor chip on which a semiconductor integrated circuit is formed, including a memory chip, a logic chip, a digital chip, an analog chip, a sensor chip, a wireless and radio frequency chip or a voltage regulator chip. Therein, the sensor chip may be an image sensor chip which at least includes a CCD or a CMOS image sensor. Alternatively, the second substrate 120 may be a package substrate, for example, a flexible substrate, a soft substrate, an interposer substrate or a printed circuit board.

According to an embodiment of the disclosure, the first substrate 110 and the second substrate 120 may be the same type. For example, the first substrate 110 may be a memory chip or a logic chip, and the second substrate 120 may be an image sensor chip. Alternatively, the first substrate 110 and the second substrate 120 may be different types. For example, the first substrate 110 may be a package substrate (e.g., a flexible substrate or a printer circuit board), and the second substrate 120 may be a semiconductor chip (e.g., a memory chip, a logic chip or an image sensor chip).

For example, the second contact 160 is formed of a conductive material. The second contact 160 may include the conductive material which is selected from, for example, Ni, Sn, Au, Cu, Ag, an alloy thereof or a composite material thereof, but the disclosure is not limited thereto. The second contact 160 may be a pier-like or a columnar structure, and a cross-sectional shape thereof may be a circular shape, an elliptic shape, a quadrilateral shape, a hexagonal shape, an octagonal shape or any polygonal shape. According to an embodiment of the disclosure, the second contact 160 may be a single structure formed of a single material or a structure composed of different material blocks. The second wiring 122 may be, for example, an electrical structure, such as a track, a wire, a circuit pattern or the like.

The first contact 150 and the second contact 160 may be formed of the same material or different materials. According to an embodiment of the disclosure, the first contact 150 and the second contact 160 may have different structures and shapes from each other. For example, the first contact 150 may be a thin circular pad-like structure, and the second contact 160 may be a circular columnar structure, but the disclosure is not limited thereto. In addition, the first contact 150 and the second contact 160 may have structures and shapes which are the same as or similar to each other.

In the present exemplary embodiment, the bonding material 154 is disposed on each of the surface of the first contact 150 and the surface of the second contact 160. In some other embodiments, the bonding material 154 may be disposed only on any one of the surface of the first contact 150 and the surface of the second contact 160. For example, the bonding material 154 may be disposed only on the surface of the first contact 150 or on the surface of the second contact 160.

The bonding material 154 may include a low-temperature bonding metal, for example, twinned-Cu, twinned-Ag or other nano-twinned materials, indium-tin (Sn In) alloys, tin-bismuth (Sn Bi) alloys, porous gold or a combination thereof. In the disclosure, the low-temperature bonding metal refers to a metal with a melting point roughly below 200° C. In comparison with a reflow temperature required by conventional solder balls or solder which is commonly higher than or equal to 250° C., the use of the low-temperature bonding metal may achieve stable bonding of a connection structure at a relatively low heating temperature and satisfy reliability required for electrically connection. According to an embodiment of the disclosure, in a condition that the bonding material 154 is disposed on each of the first contact 150 and the second contact 160, the bonding material 154 on the first contact 150 and the bonding material 154 on the second contact 160 may be formed of the same material or different materials. Preferably, the bonding material 154 on the first contact 150 and the bonding material 154 on the second contact 160 are formed of the same material. According to an embodiment of the disclosure, the bonding material 154 may be formed on the surface of the first contact 150 and/or the surface of the second contact 160 to be bonded by a plating method, such as, electroplating or sputtering.

Figure 1C:
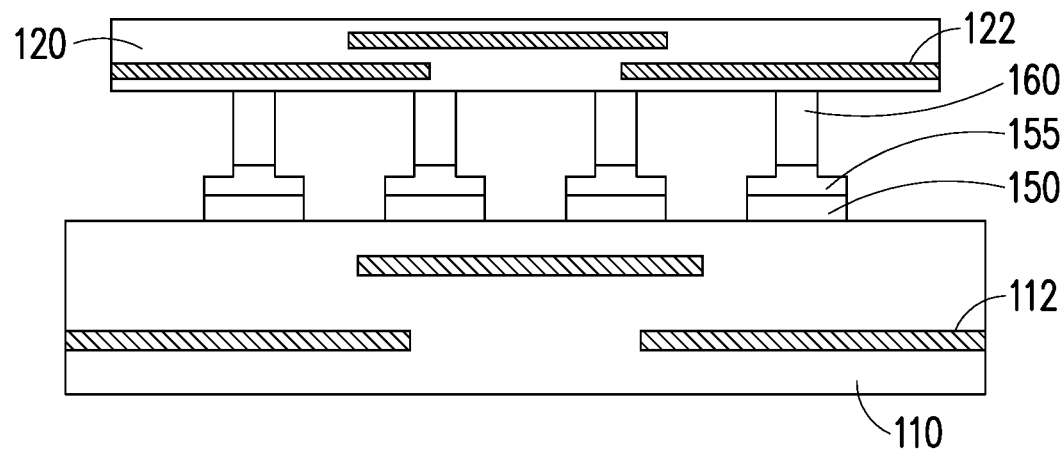

Then, referring to FIG. 1C, each second contact 160 is aligned to each corresponding first contact 150 for the bonding material 154 on the second contact 160 and the bonding material 154 on the first contact 150 to contact with each other. Then, a compression bonding process is performed, in a heating condition or a pressurizing and heating condition, such that the bonding materials 154 on the surface of the first contact 150 and the bonding materials 154 on the surface of the second contact 160 are connected and bonded with each other to form a bonding layer 155. According to an embodiment of the disclosure, a heating temperature during the compression bonding process may be 80° C. to 180° C. According to an embodiment of the disclosure, depending on material used by the bonding material 154, the heating temperature during the compression bonding process may be 80° C. to 100° C. According to an embodiment of the disclosure, depending on material used by the bonding material 154, the heating temperature during the compression bonding process may be 100° C. to 150° C. According to an embodiment of the disclosure, depending on material used by the bonding material 154, the heating temperature during the compression bonding process may be 150° C. to 180° C. The bonding material 154 (i.e., the material for forming a bonding layer 155) used in the disclosure is a low-temperature bonding metal. Thus, in comparison with the solder or the solder balls allowed for being bonded only in the soldering condition that the temperature is higher than or equal to 250° C., the material used by the bonding material 154 in the present embodiment and including the low-temperature bonding metal is capable of being bonded at a process temperature below 200° C. to form the bonding layer 155 of the disclosure to connect the first contact 150 and the second contact 160. Thereby, degradation in conditions of the high-temperature process and affection to the performance of the overall semiconductor package may be prevented.

Referring to FIG. 1C and FIG. 3A, in the present embodiment, the second contact 160 and the first contact 150 are connected with each other through the bonding layer 155. According to an embodiment of the disclosure, depending on an amount of the bonding material 154 used, when the bonding material 154 is disposed on each of the surface of the first contact 150 and the surface of the second contact 160, since the amount of the bonding material 154 used is more, the second contact 160 and the first contact 150 after being heated and compression-bonded are connected with each other through the bonding layer 155. Namely, the bonding layer 155 is clipped between the second contact 160 and the first contact 150. However, in other embodiments, when the bonding material 154 is disposed only on the surface of the first contact 150 or on the surface of the second contact 160, since the amount of the bonding material 154 used is less, referring to FIG. 3B, the second contact 160 and the first contact 150 after being heated and compression-bonded may directly physically contact with each other, and the bonding layer 155 surrounds the bonding place to enhance reliability of the bonding place. Referring to FIG. 3B, substantially the entire of the bottom surface 160*a* of the second contact 160 and the first contact 150 directly physically contact with each other. However, in other embodiments, at least a part of the bottom surface 160a of the second contact 160 directly physically contacts with the first contact 150, while a part of the bonding layer 155 remains being clipped between the second contact 160 and the first contact 150.

Figure 1D:
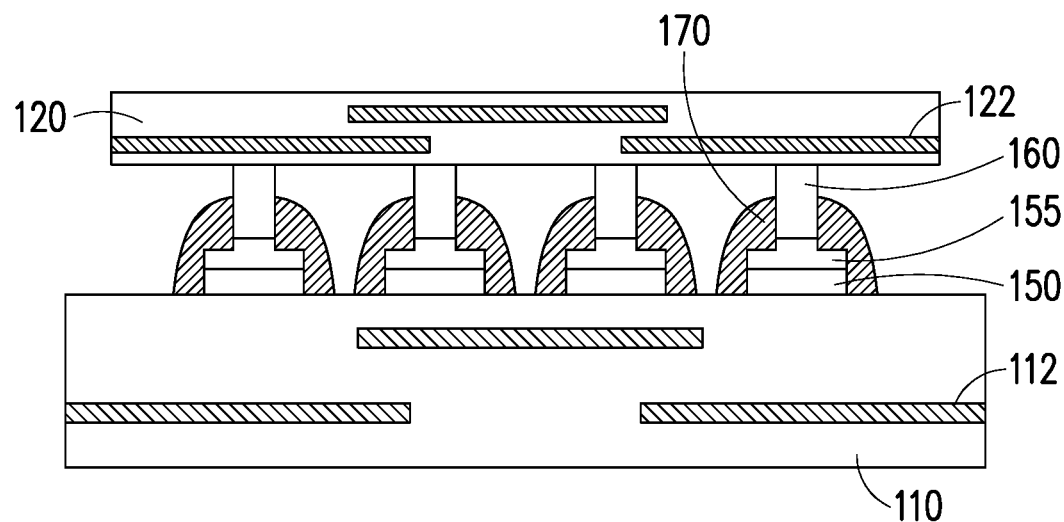

Then, referring to FIG. 1D, a plating process is performed to form a plating member 170, and the plating member 170 is formed between the first substrate 110 and the second substrate 120 and on at least part of surfaces of the first contact 150, the bonding layer 155 and the second contact 160. According to an embodiment of the disclosure, the plating member 170 may at least cover a part of the surface of the first contact 150, a part of the surface of the bonding layer 155 and a part of the surface of the second contact 160. The plating member 170 may be formed through, for example, an electroless plating method or other plating methods. The plating member 170 may be formed of a conductive material. For example, an applicable conductive material includes Ni, Sn, Au, Cu, Ag, In, Pt, Co, an electroless plating metal composite, an electroless plating complex alloy and/or a combination thereof. The material of the plating member 170 may be respectively the same or different from the material of the second contact 160 or the material of the first contact 150. In addition, the material of the plating member 170 and the material of the bonding layer 155 may be the same or different. In some embodiments, the plating member 170 may be made of copper. For example, the first contact 150 and the second contact 160 may be made of copper, the bonding material 154 may be made of the Sn—In alloy, and the plating member 170 may be made of nickel.

The plating member 170 may simultaneously cover an outer surface of the second contact 160, an outer surface of the bonding layer 155 and an outer surface of the first contact 150. The plating member 170 may facilitate improving the connection and fastening between the first contact 150 and the second contact 160, as well as improving reliability of the electrical connection among the second contact 160, the bonding layer 155 and the first contact 150.

Subsequently, an underfilling process may be selectively performed to fill an underfill or a sealant between the first substrate 110 and the second substrate 120 and in a space among the first substrate 110, the second substrate 120 and the plating member 170, so as to further fix and protect an exposed surface of the connection structure to prevent the connection between the first substrate 110 and the second substrate 120 from being damaged by pollution or mist from the outside.

Referring to FIG. 2, the semiconductor package structure 100 according to the first embodiment of the disclosure at least includes the first substrate 110 having the first wiring 112 and the second substrate 120 having the second wiring 122 and disposed above the first substrate 110. The semiconductor package structure 100 further includes a connection structure 10. The connection structure 10 at least includes the first contact 150, the second contact 160, the bonding layer 155 and the plating member 170. The first contact 150 is disposed on a surface of the first substrate 110 facing the second substrate 120, and the first contact 150 is electrically connected to the first wiring 112 of the first substrate 110. The second contact 160 is disposed on a surface of the second substrate 120 facing the first substrate 110, and the second contact 160 is electrically connected to the second wiring 122 of the second substrate 120. The second contact 160 and the first contact 150 are disposed corresponding to each other in a one-to-one corresponding manner. By viewing in a vertical direction in FIG. 2, a position of the second contact 160 and a position of the first contact 150 at least partially overlap with each other. In other words, the position of the second contact 160 is aligned to the position of the first contact 150.

According to an embodiment of the disclosure, a cross-sectional area/size of the second contact 160 is smaller than a cross-sectional area/size of the first contact 150, the second contact 160 is connected to the corresponding first contact 150, but occupies only a part of the cross-sectional area of the first contact 150. The bonding layer 155 may be disposed between the first contact 150 and the second contact 160 and directly physically contacts with the first contact 150 and the second contact 160. The first wiring 112 in the first substrate 110 and the second wiring 122 in the second substrate 120 may be electrically connected with each other at least through the first contact 150, the second contact 160 and the bonding layer 155. In other words, the first wiring 112 in the first substrate 110 and the second wiring 122 in the second substrate 120 may be electrically connected with each other through the connection structure 10. The plating member 170 may be disposed on the outer surface of the first contact 150, on the outer surface of the second contact 160 and on the outer surface of the bonding layer 155. A sealant 180 is disposed between the first substrate 110 and the second substrate 120 and wraps the plating member 170. The space among the first substrate 110, the second substrate 120 and the plating member 170 may be partially or completely filled with the sealant 180. The sealant 180 may further enhance fixing the connection structure 10 and protect a surface of the connection structure 10 to prevent the connection structure 10 from being damaged by pollution or mist from the outside, so as to improve reliability of electrical connection between the first substrate 110 and the second substrate 120.

In FIG. 2, the plating member 170 substantially completely covers the outer surface (i.e., a non-bonding surface) of the first contact 150, the outer surface (i.e., a non-bonding surface) of the second contact 160 and the outer surface (i.e., a non-bonding surface) of the bonding layer 155. In other words, an outmost layer of a connection structure 20 between the first substrate 110 and the second substrate 120 is constituted by the plating member 170. However, in other embodiments, the plating member 170 may only cover a part of the surface of the first contact 150 or a part of the surface of the second contact 160. Yet, the plating member 170 at least directly contacts the outer surface of the first contact 150, the outer surface of the second contact 160 and the outer surface of the bonding layer 155.

A material for forming the sealant 180 may include a polymer-based material, for example, a molding underfilling material, an epoxide, a resin or a combination thereof.

Figure 4A:
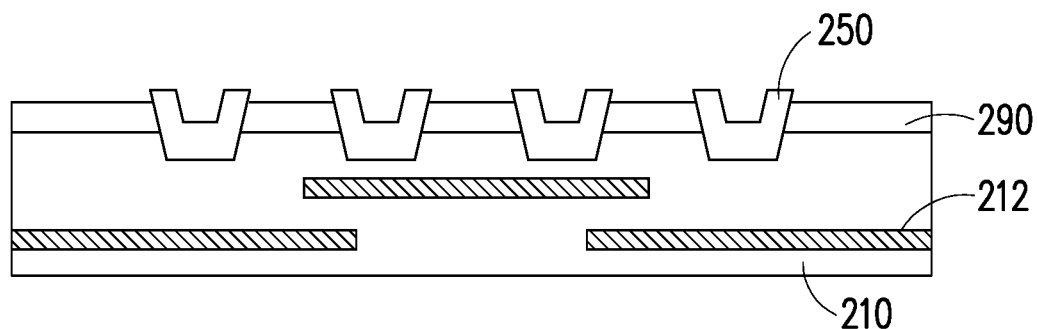
FIG. 4A through FIG. 4C are schematic cross-sectional views showing part of steps of a process for manufacturing a semiconductor package structure according to a second embodiment of the disclosure.
Figure 4B:
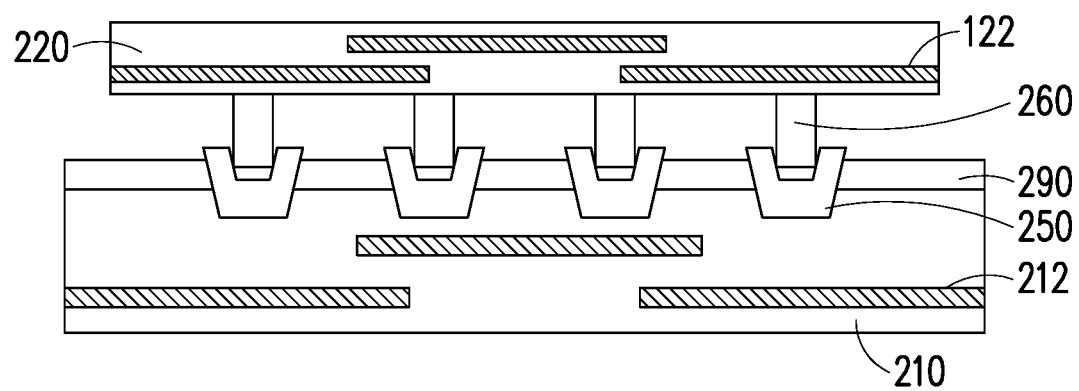
Figure 4C:
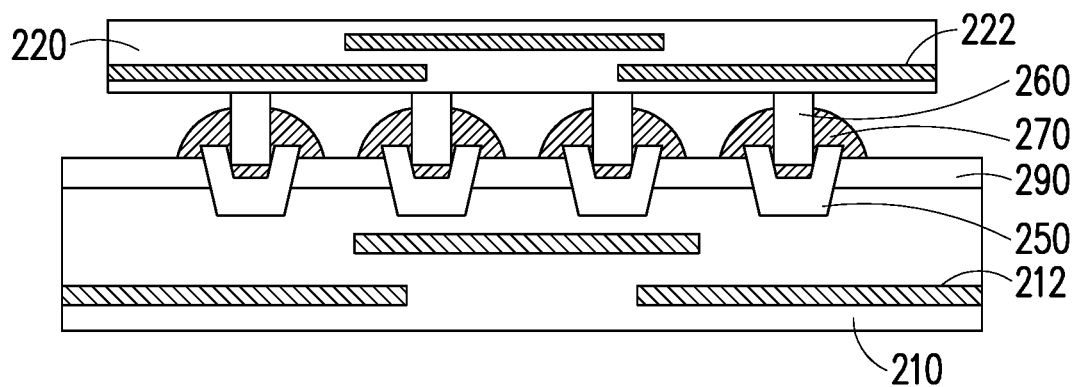
Figure 5:
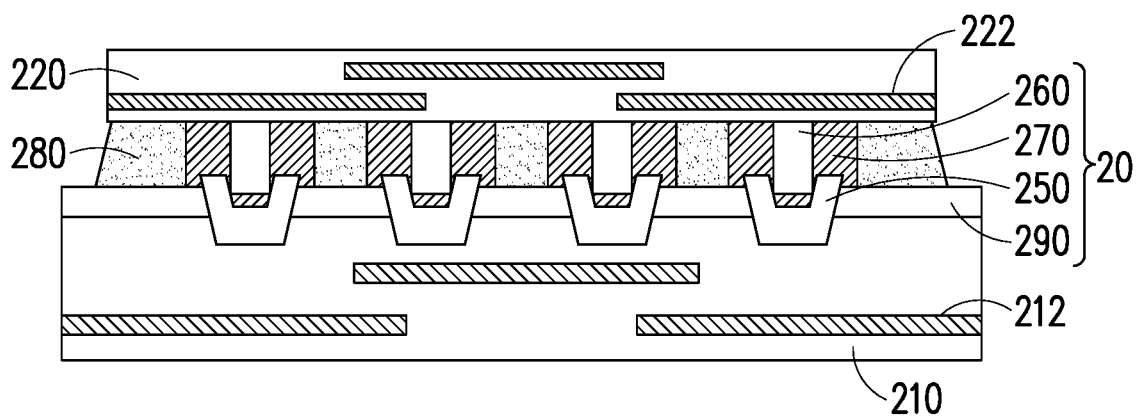
FIG. 5 is a schematic cross-sectional view showing the semiconductor package structure including a connection structure according to the second embodiment of the disclosure.
Figure 6A:
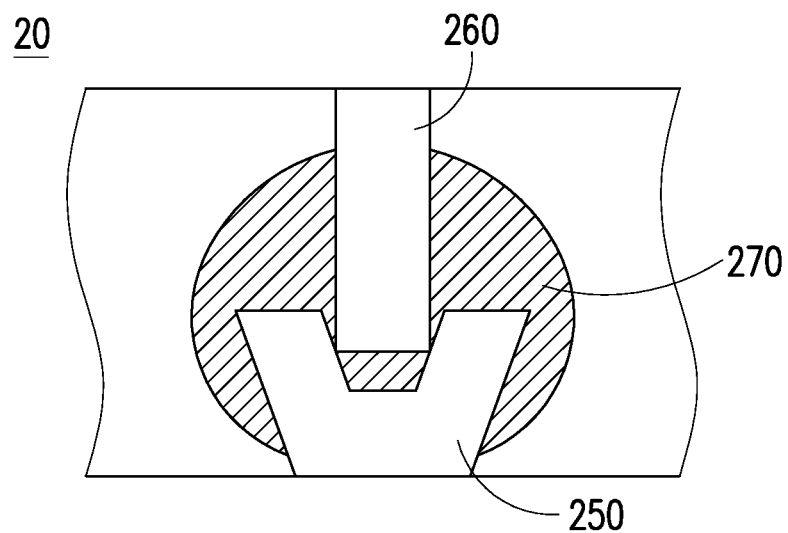
FIG. 6A is a schematic enlarged cross-sectional view showing the connection structure in the package structure according to the second embodiment of the disclosure.
Figure 6B:
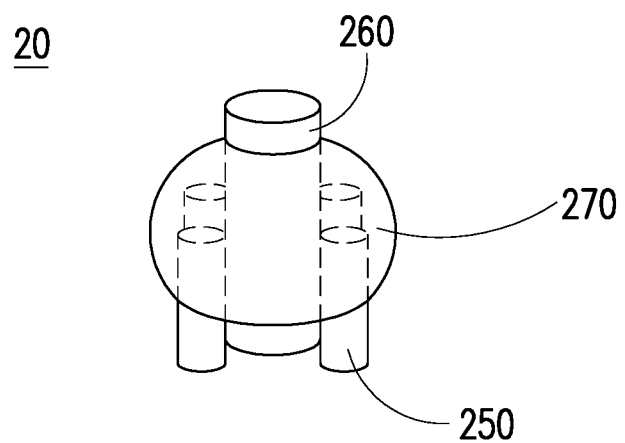
FIG. 6B is a schematic perspective view illustrating another example of the connection structure in the package structure according to the second embodiment of the disclosure.

FIG. 4A through FIG. 4C are schematic cross-sectional views showing part of steps of a process for manufacturing a semiconductor package structure according to a second embodiment of the disclosure. FIG. 5 is a schematic cross-sectional view showing the semiconductor package structure including a connection structure according to the second embodiment of the disclosure. FIG. 6A is a schematic enlarged cross-sectional view showing the connection structure in the package structure according to the second embodiment of the disclosure. FIG. 6B is a schematic perspective view illustrating another example of the connection structure in the package structure according to the second embodiment of the disclosure.

Hereinafter, a method for connecting different components during the process for manufacturing the package structure according to the second embodiment of the disclosure will be described with reference to FIG. 4A through FIG. 4C.

First, referring to FIG. 4A, a first substrate 210 with a passivation layer 290 and a first contact 250 on a surface thereof is provided.

For example, a passivation layer 290 is formed by a vapor deposition method, a spinning method, a printing method or any other method according to a shape of the surface of the first substrate 210. Then, an opening is formed in the passivation layer 290, the opening may expose a first wiring 212 in the first substrate 210. A material of the passivation layer 290 may be an organic insulation material or an inorganic insulation material. For example, the organic insulation material may include a thermoplastic resin or a thermosetting resin, such as a polyimide, and the inorganic insulation material may include, such as $SiO_2$ or SiN.

Then, the first contact 250 is formed in the opening of the passivation layer 290. The first contact 250 may be electrically connected to the first wiring 212 in the first substrate 210, and the first contact 250 may have a recess. A method for forming the first contact 250 may include a chemical vapor deposition (CVD) process, a physical vapor deposition (PVD) process, a sputtering process or an electroplating process to fill a conductive material in the opening of the passivation layer 290. Then, a recess may be formed in the conductive material by an etching process or a sandblasting method. The conductive material is selected from Ni, Sn, Au, Cu, Ag, an alloy thereof or a composite material thereof, but the disclosure is not limited thereto.

Then, referring to FIG. 4B and FIG. 6A, a second substrate 220 with a second contact 260 on a surface thereof is provided. The second contact 260 may be electrically connected to a second wiring 222 in the second substrate 220. Then, the first contact 250 and the second contact 260 partially contact with each other to connect the first substrate 210 and the second substrate 220 with each other.

The first contact 250 and the second contact 260 may partially physically contact with each other or may partially chemically interface reactive contact with each other. After the first contact 250 and the second contact 260 partially chemically interface reactive contact with each other, a metal on a contact surface between the first contact 250 and the second contact 260 causes a chemical reaction to form an intermetallic compound (IMC) or an alloy solid solution.

The second contact 260 may be a columnar structure, and a cross-sectional shape thereof may be a circular shape, an elliptic shape, a quadrilateral shape, a hexagonal shape, an octagonal shape or any polygonal shape. The second contact 260 may be a single structure formed of a signal material or a structure composed of different material blocks. Referring to FIG. 6A, the second contact 260 may be clamped in the recess of the first contact 250. If necessary, a pressure may be applied to the connection structure 20 to enhance a clamping force between the second contact 260 and the first contact 250. According to an embodiment of the disclosure, the first contact 250 and the second contact 260 may be connected to each other without being heated, thereby preventing degradation in conditions of the high-temperature process or affection to the performance of the components in the package structure.

Then, referring to FIG. 4C, a plating process is performed to form a plating member 270, and the plating member 270 is formed between the first substrate 210 and the second substrate 220, on at least a part of the surface of the first contact 250 and at least a part of the surface of the second contact 260 and between the first contact 250 and the second contact 260. According to an embodiment of the disclosure, the plating member 270 may at least cover a part of the surface of the first contact 250 and a part of the surface of the second contact 260. A material of the plating member 270 may be respectively the same as or different from a material of the second contact 260 or a material of the first contact 250. The plating member 270 may simultaneously cover a part of the surface of the first contact 250 and a part of the surface of the second contact 260 and be filled in the recess of the first contact 250. If necessary, the plating member 270 may be disposed between the first contact 250 and the second contact 260. The plating member 270 may facilitate improving the connection and fastening between the first contact 250 and the second contact 260, as well as improving reliability of the electrical connection between the first contact 250 and the second contact 260.

Subsequently, an underfilling process may be selectively performed to fill an underfill or a sealant between the first substrate 210 and the second substrate 220 and in a space among the first substrate 210, the second substrate 220 and the plating member 270, so as to further fix and protect an exposed surface of the connection structure to prevent the connection between the first substrate 210 and the second substrate 220 from being damaged by pollution or mist from the outside.

Referring to FIG. 5, the semiconductor package structure 200 according to the second embodiment of the disclosure at least includes the first substrate 210 having the first wiring 212 and the second substrate 220 having the second wiring 222 and disposed above the first substrate 210. The semiconductor package structure 200 further includes a connection structure 20, and the connection structure 20 at least includes the first contact 250, the second contact 260 and the plating member 270. The semiconductor package structure 200 may further selectively include the passivation layer 290 disposed on a surface of the first substrate 210 facing the second substrate 220 and between each first contact 250. The first contact 250 is disposed on a surface of the first substrate 210 facing the second substrate 220, and the first contact 250 is electrically connected to the first wiring 212 of the first substrate 210. The first contact 250 may have the recess. The second contact 260 is disposed on a surface of the second substrate 220 facing the first substrate 210, and the second contact 260 is electrically connected to the second wiring 222 of the second substrate 220. The second contact 260 and the first contact 250 are disposed corresponding to each other in a one-to-one corresponding manner. The second contact 260 may be clamped in the recess of the first contact 250 and partially contacts with the first contact 250. In other words, a position of the second contact 260 is aligned to a position of the recess of the first contact 250 and is clamped in the recess of the first contact 250.

The first wiring 212 in the first substrate 210 and the second wiring 222 in the second substrate 220 may be electrically connected with each other at least through the first contact 250 and the second contact 260. In other words, the first wiring 212 in the first substrate 210 and the second wiring 222 in the second substrate 220 may be electrically connected with each other through the connection structure 20. The plating member 270 may be disposed on an outer surface of the first contact 250 and an outer surface of the second contact 260, be filled in the recess of the first contact 250 and be filled in a space between the first contact 250 and the second contact 260. A sealant 280 is disposed between the first substrate 210 and the second substrate 220 and wraps the plating member 270.

In FIG. 4 through FIG. 6, the recess of the first contact 250 is presented in a trapezoidal shape of which the top width is greater than the bottom width, but the disclosure is not limited thereto. For example, referring to FIG. 6B, the first contact 250 may be presented in a form consisting a plurality of cylinders, and the second contact 260 may be fitted in a space among the cylinders and partially contacts with the first contact 250. In other words, the disclosure is not intent to limit a shape of the recess in the first contact 250, as long as the recess of the first contact 250 may provide a space for accommodating at least a part of the second contact 260 for the first contact 250 and the second contact 260 to partially connect with each other. According to an embodiment of the disclosure, depending on the shape of the recess of the first contact 250, the second contact 260 may be clamped in the recess of the first contact 250.

In FIG. 5, the plating member 270 substantially completely covers the outer surface of the first contact 250 and the outer surface of the second contact 260 and is completely filled in the recess of the first contact 250 and the space between the first contact 250 and the second contact 260. In other words, an outmost layer of the connection structure 20 between the first substrate 210 and the second substrate 220 is constituted by the plating member 270. However, in other embodiments, for example, as illustrated in FIG. 6A, the plating member 270 may only cover a part of the surface of the first contact 250 or a part of the surface of the second contact 260. Yet, the plating member 270 at least directly contacts the outer surface of the first contact 250 and the outer surface of the second contact 260 and is filled in the recess of the first contact 250. If necessary, the plating member 270 may be filled in the space between the first contact 250 and the second contact 260.

Unless there are other obvious contradictions or inapplicable descriptions, the descriptions related to the components having the same names in the first embodiment are also applicable to the components having the same names in the present embodiment, and thus, the descriptions are not repeated.

Figure 8:
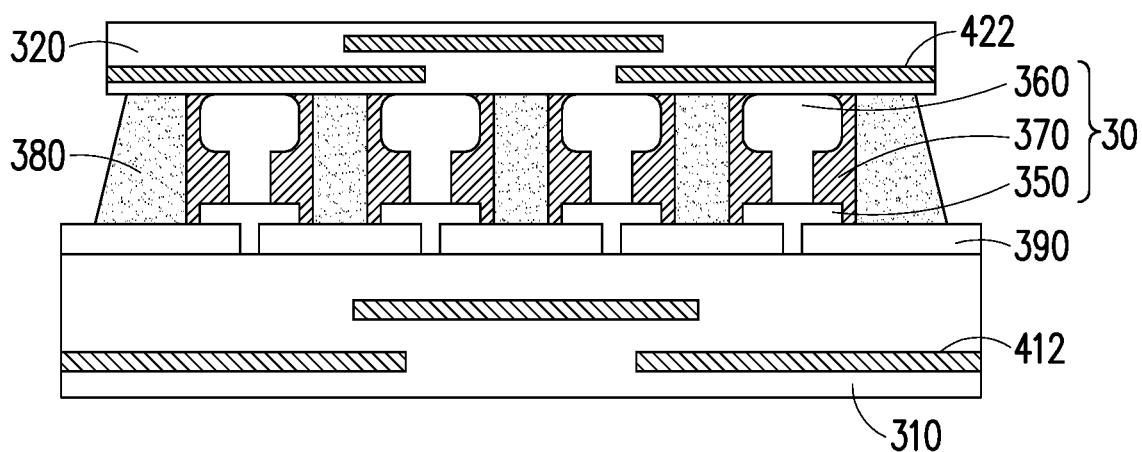
FIG. 8 is a schematic cross-sectional view showing the semiconductor package structure including a connection structure according to the third embodiment of the disclosure.
Figure 9A:
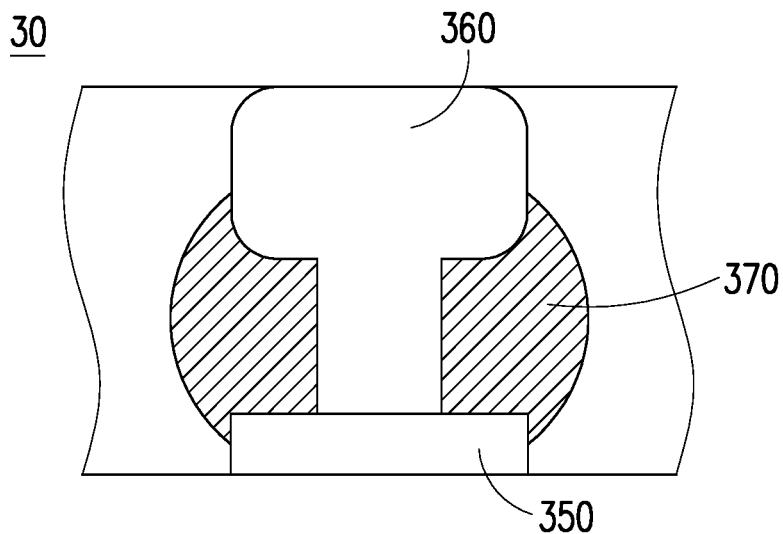
FIG. 9A through FIG. 9C are schematic enlarged cross-sectional views respectively showing examples of the connection structure in the package structure according to the third embodiment of the disclosure.
Figure 9B:
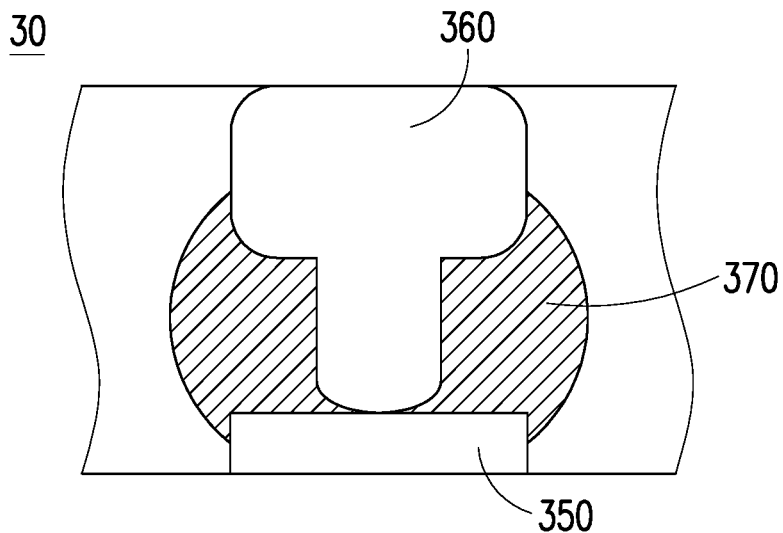
Figure 9C:
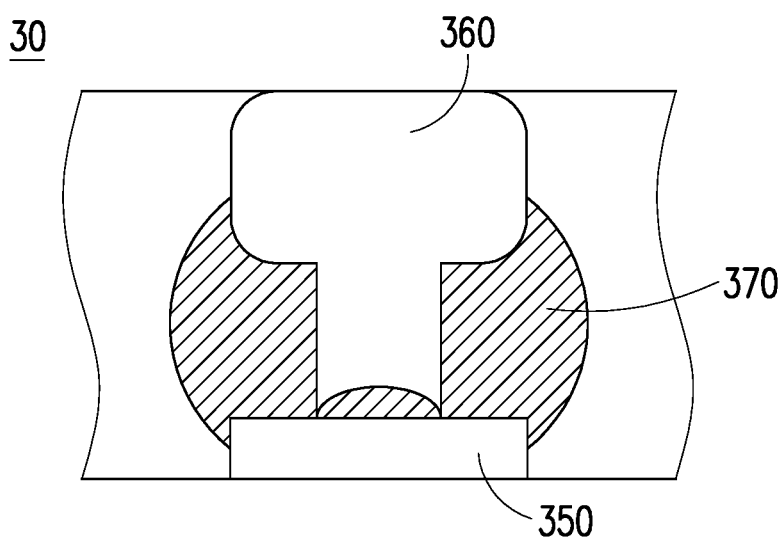

FIG. 7A through FIG. 7D are schematic cross-sectional views showing part of steps of a process for manufacturing a semiconductor package structure according to a third embodiment of the disclosure. FIG. 8 is a schematic cross-sectional view showing the semiconductor package structure including a connection structure according to the third embodiment of the disclosure. FIG. 9A through FIG. 9C are schematic enlarged cross-sectional views respectively showing examples of the connection structure in the package structure according to the third embodiment of the disclosure.

Hereinafter, a method for connecting different components during the process for manufacturing the package structure according to the third embodiment of the disclosure will be described with reference to FIG. 7A through FIG. 7D.

Figure 7A:
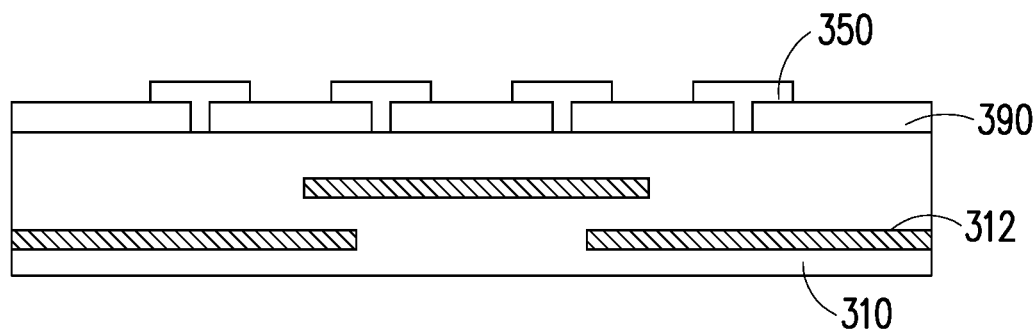
FIG. 7A through FIG. 7D are schematic cross-sectional views showing part of steps of a process for manufacturing a semiconductor package structure according to a third embodiment of the disclosure.

First, referring to FIG. 7A, a first substrate 310 with a passivation layer 390 on a surface thereof is provided. The passivation layer 390 has an opening, and the opening may expose a first wiring 312 in the first substrate 310. Then, a first contact 350 is formed in the opening of the passivation layer 390. The first contact 350 may be electrically connected to the first wiring 312 in the first substrate 310. For example, the first contact 350 is formed of a conductive material. The first contact 350 may include the conductive material which is selected from, for example, Ni, Sn, Au, Cu, Ag, an alloy thereof or a composite material thereof, but the disclosure is not limited thereto. According to an embodiment of the disclosure, the first contact 350 may be a pad-like or a pier-like structure, and a cross-sectional shape thereof may be a circular shape, an elliptic shape, a quadrilateral shape, a hexagonal shape, an octagonal shape or any polygonal shape. According to an embodiment of the disclosure, the first contact 350 may be a single structure formed of a single material or a structure composed of different material blocks.

Figure 7B:
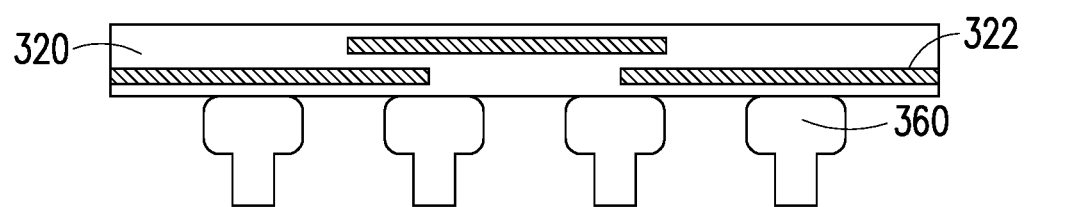
Figure 7B:
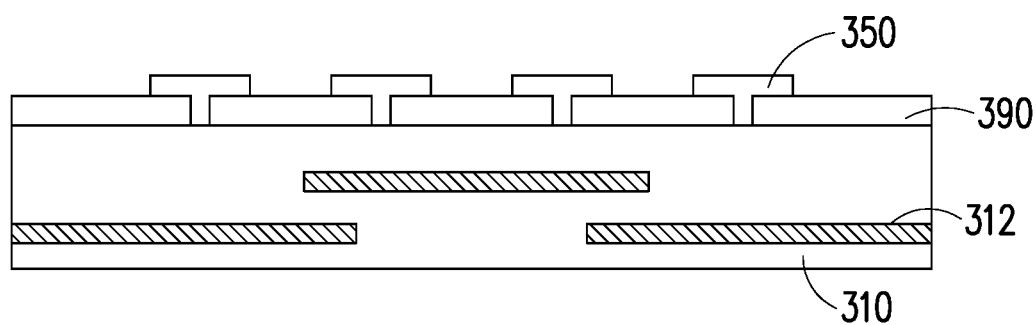

Then, referring to FIG. 7B, a second substrate 320 with a second contact 360 on a surface thereof is provided. The second contact 360 may be electrically connected to a second wiring 322 in the second substrate 320. In the present embodiment, the first contact 350 and the second contact 360, except for having no bonding material disposed on the surfaces, are similar to the first contact 150 and the second contact 160 of the first embodiment in the structures or materials. The descriptions related thereto may be inferred with reference to those related to the first embodiment and will not be repeated.

Figure 7C:
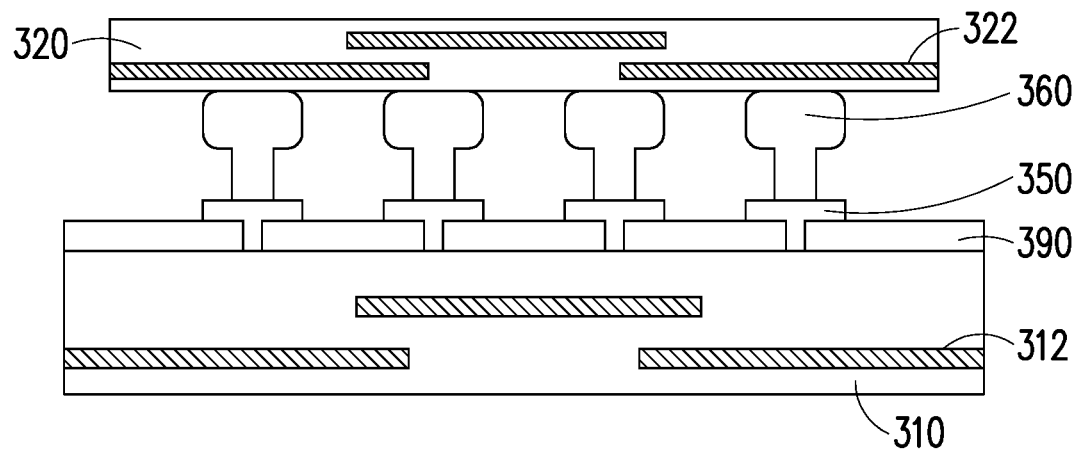

Then, referring to FIG. 7C and FIG. 9, the second contact 360 and the corresponding first contact 350 are aligned to each other and contact with each other. In other words, at least a bottom surface of the second contact 360 and a top surface of the first contact 350 contact with each other. Referring to FIG. 9A, the bottom surface of the second contact 360 and the top surface of the first contact 350 flatly contact with each other. Alternatively, referring to FIG. 9B and FIG. 9C, the top surface of the first contact 350 and the bottom surface of the second contact 360 may not be flat, such that the top surface of the first contact 350 and the bottom surface of the second contact 360 only partially contact with each other. According to other embodiments of the disclosure which are not shown, the second contact 360 may also pass through the top surface of the first contact 350 to be temporarily fixed in the first contact 350. Then, an ultrasonic welding process may be performed to bond the second contact 360 and the first contact 350. Since no heating process is required in the ultrasonic welding process, degradation in conditions of the high-temperature process or affection to the performance of the components in the package structure may be prevented.

The first contact 350 and the second contact 360 may partially physically contact with each other or partially chemically interface reactive contact with each other. After the first contact 350 and the second contact 360 partially chemically interface reactive contact with each other, a metal on a contact surface between the first contact 350 and the second contact 360 causes a chemical reaction to form an IMC or an alloy solid solution.

Figure 7D:
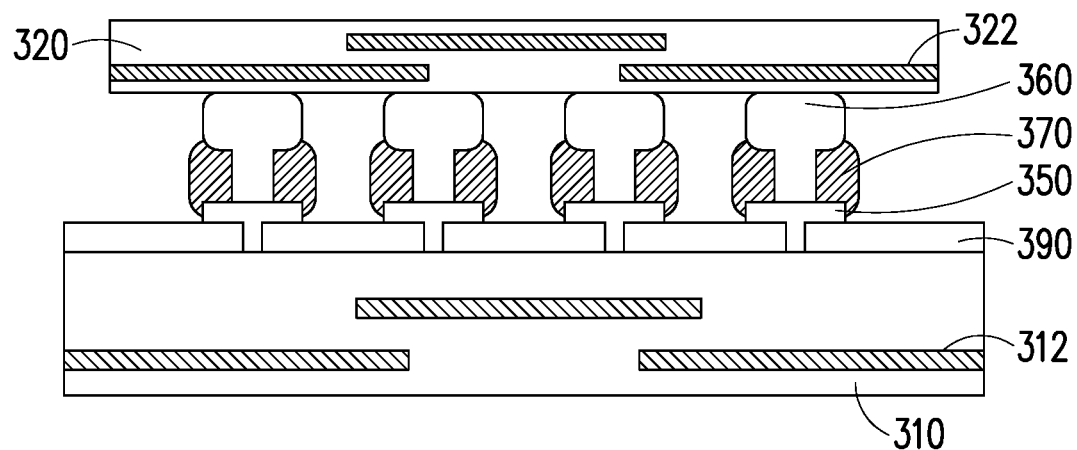

Then, referring to FIG. 7D, a plating process is performed to form a plating member 370, and the plating member 370 is formed between the first substrate 310 and the second substrate 320 and on at least a part of the surface of the first contact 350 and at least a part of the surface of the second contact 360. According to an embodiment of the disclosure, the plating member 370 may at least cover a part of the surface of the first contact 350 and may at least cover a part of the surface of the second contact 360. A material of the plating member 370 may be respectively the same as or different from a material of the second contact 360 or a material of the first contact 350. If necessary, the plating member 370 may be disposed between the first contact 350 and the second contact 360.

The plating member 370 may simultaneously cover an outer surface of the second contact 360 and an outer surface of the first contact 350. The plating member 370 facilitate improving the connection and fastening between the first contact 350 and the second contact 360, as well as improving reliability of the electrical connection between the first contact 350 and the second contact 360.

Subsequently, an underfilling process may be selectively performed to fill an underfill or a sealant between the first substrate 310 and the second substrate 320 and in a space among the first substrate 310, the second substrate 320 and the plating member 370, so as to further fix and protect an exposed surface of the connection structure to prevent the connection between the first substrate 310 and the second substrate 320 from being damaged by pollution or mist from the outside.

Referring to FIG. 8, the semiconductor package structure 300 according to the third embodiment of the disclosure at least includes the first substrate 310 having the first wiring 312 and the second substrate 320 having the second wiring 322 and disposed on the first substrate 310. The semiconductor package structure 300 further includes a connection structure 30, and the connection structure 30 at least includes the first contact 350, the second contact 360 and the plating member 370. The semiconductor package structure 300 may further selectively include the passivation layer 390 disposed on a surface of the first substrate 310 facing the second substrate 320. The first contact 350 is disposed on the surface of the first substrate 310 facing the second substrate 320. The first contact 350 is electrically connected to the first wiring 312 of the first substrate 310. The second contact 360 is disposed on a surface of the second substrate 320 facing the first substrate 310. The second contact 360 is electrically connected to the second wiring 322 of the second substrate 320. The second contact 360 and the first contact 350 are disposed corresponding to each other in a one-to-one corresponding manner. The bottom surface of the second contact 360 and the top surface of the first contact 350 may physically contact with each other. In other words, a position of the second contact 360 is aligned to a position of the first contact 350.

According to an embodiment of the disclosure, a cross-sectional area/size of the second contact 360 is smaller than a cross-sectional area/size of the first contact 350, and the second contact 360 is connected to the corresponding first contact 350, but occupies only a part of the cross-sectional area of the first contact 350. The first wiring 312 in the first substrate 310 and the second wiring 322 in the second substrate 320 may be electrically connected with each other at least through the first contact 350 and the second contact 360. In other words, the first wiring 312 in the first substrate 310 and the second wiring 322 in the second substrate 320 may be electrically connected with each other through the connection structure 30. The plating member 370 may be disposed on the outer surface of the first contact 350 and on the outer surface of the second contact 360. If necessary, the plating member 370 may be disposed between the first contact 350 and the second contact 360. A sealant 380 is disposed between the first substrate 310 and the second substrate 320 and wraps the plating member 370.

In FIG. 8, the plating member 370 substantially completely covers the outer surface of the first contact 350 and the outer surface of the second contact 360. In other words, an outmost layer of the connection structure 30 between the first substrate 310 and the second substrate 320 is constituted by the plating member 370. However, in other embodiments, for example, as illustrated in FIG. 9A, the plating member 370 may only cover a part of the surface of the first contact 350 or a part of the surface of the second contact 360. Yet, the plating member 370 at least directly contacts the outer surface of the first contact 350 and the outer surface of the second contact 360.

Unless there are other obvious contradictions or inapplicable descriptions, the descriptions related to the components having the same names in the second embodiment are also applicable to the components having the same names in the present embodiment, and thus, the descriptions are not repeated.

Figure 10:
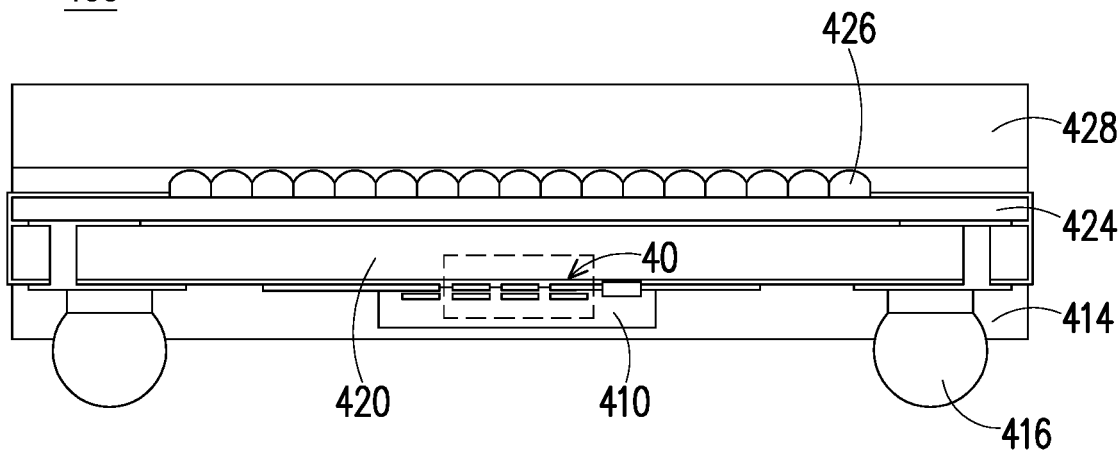
FIG. 10 is a schematic cross-sectional view showing a structure of a sensor package according to an embodiment of the disclosure.
Figure 11:
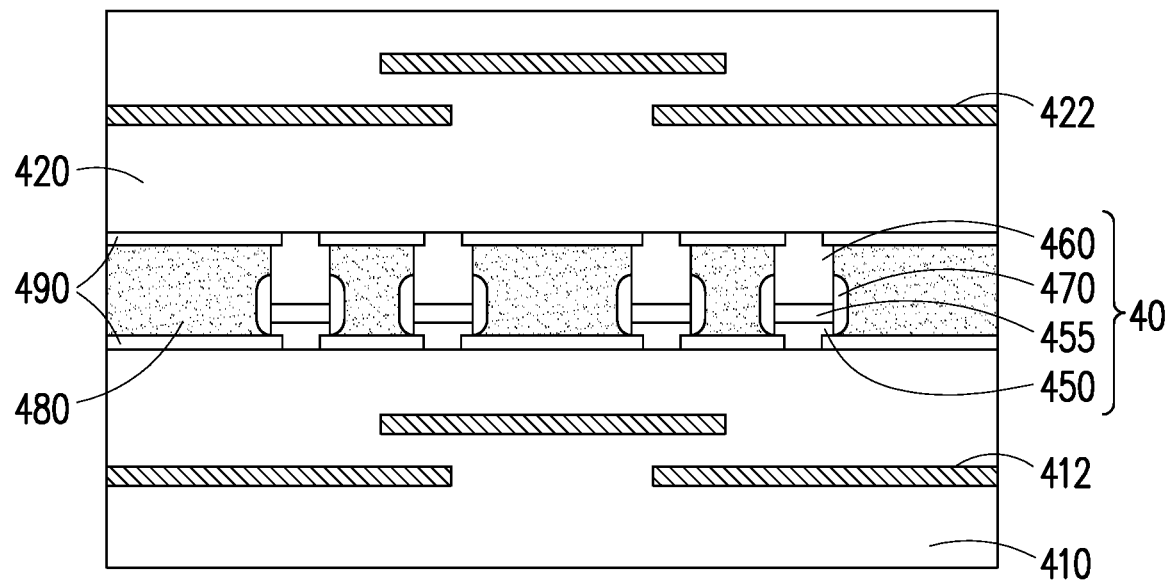
FIG. 11 is a schematic enlarged view of an area in FIG. 10 framed by a dashed line.

FIG. 10 is a schematic cross-sectional view showing a structure of a sensor package according to an embodiment of the disclosure. The structure illustrated in FIG. 10 is a sensor package structure including the package structures provided by the aforementioned embodiments of the disclosure which is integrated therein. FIG. 11 is a schematic enlarged view of an area in FIG. 10 framed by a dashed line.

Referring to FIG. 10 and FIG. 11, a sensor package 400 at least includes a light-transmitting substrate 428 located on the top of the sensor package 400, a micro-lens 426 located under the light-transmitting substrate 428, an optical detector 424 located under the micro-lens 426, a sensor chip 420 located under the optical detector 424, a memory/logic chip 410 located under the sensor chip 420, a connection structure 40 located between the sensor chip 420 and the memory/logic chip 410, a dielectric layer 414 located under the memory/logic chip 410 and solder balls 416 located on the bottom of the sensor package 400.

The memory/logic chip 410 includes a first wiring 412. The first wiring 412 may be, for example, an electrical structure, such as a track, a wire, a circuit pattern or the like. The memory/logic chip 410 may be a memory chip and/or a logic chip depending on a function of the sensor package 400. For example, the memory/logic chip 410 may be a processor chip. The sensor chip 420 includes a second wiring 422. The second wiring 422 may be, for example, an electrical structure, such as a track, a wire, a circuit pattern or the like. The optical detector 424 may convert the light entering the sensor package 400 from the light-transmitting substrate 428 and passing through the micro-lens 426 into a voltage signal and transmit the voltage signal to the sensor chip 420. The sensor chip 420 may include, for example, a semiconductor image sensor chip which at least includes a CCD or a CMOS image sensor. The memory/logic chip 410 and the sensor chip 420 may be electrically connected with each other through the connection structure 40.

The connection structure 40 at least includes a first contact 450, a second contact 460, a bonding layer 455 and a plating member 470. The first contact 450 is disposed on a surface of the memory/logic chip 410 facing the sensor chip 420, and the first contact 450 is electrically connected to the first wiring 412 of the memory/logic chip 410. The second contact 460 is disposed on a surface of the sensor chip 420 facing the memory/logic chip 410. The second contact 460 is electrically connected to the second wiring 422 in the sensor chip 420. The first contact 450 and the second contact 460 are disposed corresponding to each other in a one-to-one corresponding manner. The bonding layer 455 may be disposed between the first contact 450 and the second contact 460. The bonding layer 455 may physically contact with the first contact 450 and the second contact 460. The first wiring 412 in the memory/logic chip 410 and the second wiring 422 in the sensor chip 420 may be electrically connected with one other at least through the first contact 450, the second contact 460 and the bonding layer 455. In other words, the first wiring 412 in the memory/logic chip 410 is electrically connected to the second wiring 422 in the sensor chip 420 through the connection structure 40. The plating member 470 may be disposed on an outer surface of the first contact 450, an outer surface of the second contact 460 and an outer surface of the bonding layer 455. A sealant 480 is disposed between the memory/logic chip 410 and the sensor chip 420 and wraps the plating member 470. A passivation layer 490 may be disposed on a top surface and a bottom surface of the sealant 480.

Unless there are other obvious contradictions or inapplicable descriptions, the descriptions related to the components having the same names in the third embodiment are also applicable to the components having the same names in the present embodiment, and thus, the descriptions are not repeated.

In light of the foregoing, the disclosure provides a package structure and a manufacturing method thereof that can electrically connect the components by using the low-temperature bonding metal or the physical fixing manner without heating the components at a high temperature.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A package structure, comprising:
   a first substrate, comprising a first wiring and at least one first contact, wherein the at least one first contact is electrically connected to the first wiring;
   a second substrate, comprising a second wiring and at least one second contact, wherein the at least one second contact is electrically connected to the second wiring; and
   a third contact, located between the first contact and the second contact and directly contacting the first contact and the second contact; and
   a fourth contact, located between the first substrate and the second substrate and not in contact with the first substrate and the second substrate,
   wherein the third contact at least partially physically contacts with the first contact and the second contact,
   the fourth contact surrounds the first contact, the second contact and the third contact and physically contacts a portion of a side surface of the first contact, a portion of a side surface of the second contact and the third contact, and
   the first substrate and the second substrate are electrically connected with each other at least through the first contact, the second contact, and the third contact,
   wherein the third contact is composed of a material different from each of a material forming the first contact, a material forming the second contact, and a material forming the fourth contact, and
   the third contact is composed of a low-temperature bonding metal with a melting point below 200° C.

2. The package structure according to claim 1, wherein the low-temperature bonding metal comprises twinned-Cu, twinned-Ag, an indium-tin (Sn—In) alloy, a tin-bismuth (Sn—Bi) alloy, porous gold or a combination thereof.

3. The package structure according to claim 1, further comprising a sealant disposed between the first substrate and the second substrate.

* * * * *